United States Patent [19]

Tafjord

[11] 4,135,132
[45] Jan. 16, 1979

[54] PASSIVE FILTER COMPENSATION NETWORK

[75] Inventor: Kjartan Tafjord, Huddinge, Sweden

[73] Assignee: Telefonaktiebolaget L M Ericsson, Stockholm, Sweden

[21] Appl. No.: 763,902

[22] Filed: Jan. 31, 1977

[30] Foreign Application Priority Data

Feb. 27, 1976 [SE] Sweden .................... 7602610

[51] Int. Cl.² .................... H03H 7/10; H03H 7/14
[52] U.S. Cl. .................... 333/70 R; 333/28 R
[58] Field of Search .................... 333/70 R, 17 R, 18, 333/75, 28 R; 338/7, 9, 22 R, 25; 307/310; 324/105; 179/170 R, 170 A

[56] References Cited

U.S. PATENT DOCUMENTS

| 3,173,110 | 3/1965 | Albersheim | 333/18 |
| 3,569,869 | 3/1971 | Sutton, Jr. et al. | 333/28 X |

*Primary Examiner*—Alfred E. Smith
*Assistant Examiner*—Marvin Nussbaum
*Attorney, Agent, or Firm*—Hane, Roberts, Spiecens & Cohen

[57] ABSTRACT

A compensation network for a passive filter which compensates for the variation of the loss attenuation of the filter dependent on ambient temperature variations consists of an L-section whose series arm is formed by a temperature dependent resistor and whose shunt arm is formed by another temperature dependent resistor in series with a resonant circuit. The resonance frequency value of the resonant circuit is chosen nearly equal to the band limit frequency of the filter.

5 Claims, 5 Drawing Figures

PASSIVE FILTER COMPENSATION NETWORK

BACKGROUND OF THE INVENTION

The present invention relates to a network for a passive filter to compensate the variation of the loss attenuation of the filter dependent on ambient temperature variations. More precisely, the invention relates to a network which gives temperature compensation for a filter build up by passive components, the filter showing an operative attenuation characteristic with very high slope at the band limit. Such strong frequency selective filters are, for example, switching filters in carrier frequency equipments for through connection of one or several frequency groups within a basic primary group. The proposed network is, however, also applicable for other types of filters with high frequency selectivity.

The above-mentioned kind of filter can consist of a band pass filter built up by passive LC-elements. At high frequency selectivity, that is, when the losses of the elements, due to the propagation time of the filter cause undesired attenuation at the pass band limits, it is common, either to connect a correction network in order to compensate the characteristics of the operative attenuation at the pass band limit or to compensate the losses of the filter, according to standard method, without an additional correction network. The loss attenuation of the filter changes with the temperature and if the copper losses dominate, the change can reach, for example, 0.4%/° C. This temperature dependence remains in the compensated filter and causes an undesired change of the characteristics of the operative attenuation at the pass band limit.

It is previously known to reduce the undesired change of the loss attenuation by reducing the same, which in practice means a bigger volume of the included coils. In this way, it is possible to make the loss attenuation within a pass band so low that the temperature change will be within the specified tolerances demanded. For filters with very high demands on frequency selectivity these tolerances have, however, in the course of time, been reduced so much that this solution is no longer sufficient. Besides, the known solution implies that space consuming and expensive components must be used.

An object of the present invention is to provide a network for a passive filter, for example, of the band pass character for simple and cheap compensation of the temperature dependent loss attenuation at a chosen band limit of the filter.

DESCRIPTION OF THE DRAWINGS

The invention, the characteristics of which appear from the appended claims, will be further described in connection with the accompanying drawings where:

DESCRIPTION OF THE PREFERRED EMBODIMENTS

Figure 1:
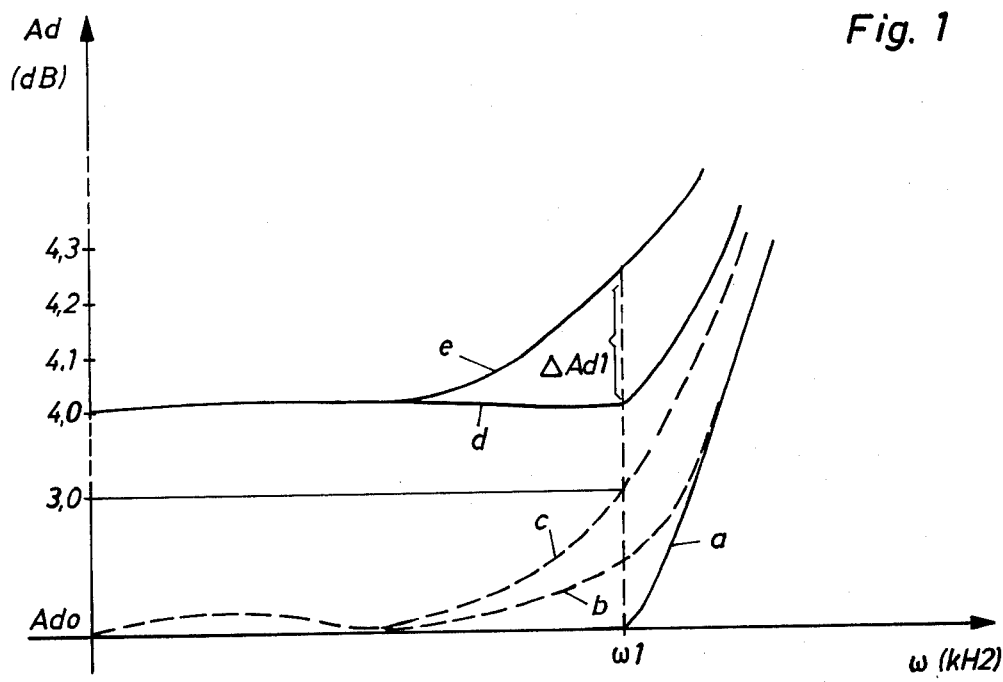
FIG. 1 shows a diagram which illustrates the characteristics of the loss attenuation of a filter and the operative attenuation for a compensated filter as well as the change in the opearative attenuation caused by the change of the loss attenuation in relation to the ambient temperature.

In FIG. 1, different operative attenuation characteristics are closely illustrated near the band limit of a passive filter of the band pass or the low pass type. Waveform a shows the operative attenuation for an ideal filter free of losses and waveform b shows the operative attenuation for a filter in which large and voluminous coils are included, in order to reduce the filter losses and to get a good temperature stability within the pass band. Waveform c shows the function of the operative attenuation for a filter in which the component size is smaller than in the case of waveform b. In order to compensate the operative attenuation character at the band limit of a filter of the type waveform c, a correction network can be connected to the filter. The correction network consists usually of resistive bridged T-network with a parallel resonant circuit in the shunt arm and in which the bridging link consists of a series resonant circuit. The attenuation of the correction network is then constant, except at its resonant frequency where the attenuation characteristics shows a minimum. The resonant frequency is suitably chosen near the chosen band limit frequency of the filter in order to equalize its operative attenuation. The equalized operative attenuation characteristic is shown in FIG. 1, waveform d. When the loss attenuation according to waveform c changes with the temperature, while the operative attenuation of the correction network is independent of temperature, the equalized attenuation, according to waveform d, will, at a higher temperature change an amount $\Delta A d\ 1$ to the characteristic according to waveform e.

Figure 2:
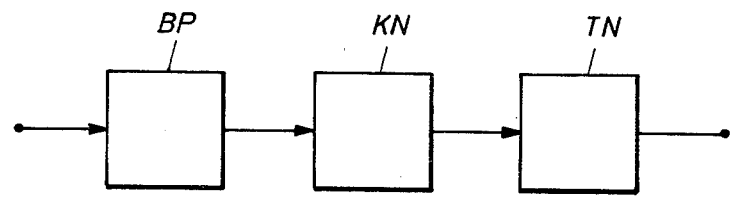
FIG. 2 shows a block diagram of a filter, a correction network and a network according to present invention.

In order to compensate for the deviation $\Delta A d\ 1$ in the operative attenuation characteristic of the compensated filter, a network has, according to the invention, been connected to the correction network as shown in the block diagram according to FIG. 2. The block BP indicates the original filter, for example, of the band pass type, the block KN the correction network and the block TN the network proposed according to the invention.

Figure 3:
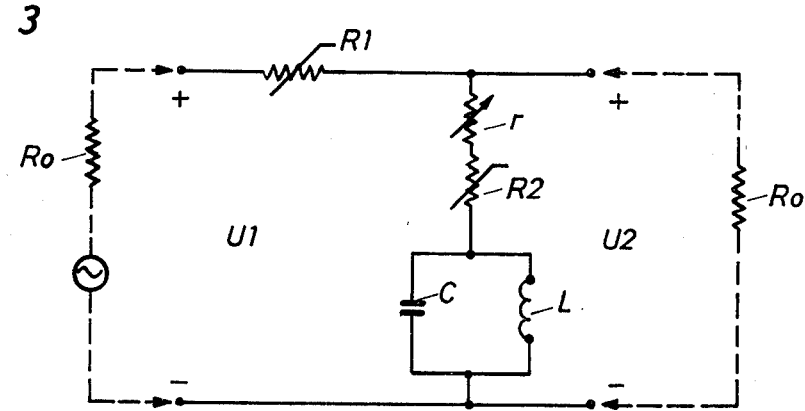
FIG. 3 shows a circuit diagram of one embodiment of a network according to the present invention.

FIG. 3 shows an embodiment of the network according to the invention. This consists of an L-link whose series arm has a temperature dependent resistor R1 which consists of a thermistor with negative temperature coefficient. In the shunt arm of the links, another temperature dependent resistor R2 of the same type as the resistor R1 is connected to a parallel resonant circuit L,C, whose resonant frequency $\omega o$ is chosen mainly equal to the chosen band limit frequency $\omega 1$, FIG. 1. For a through connection filter for the basic primary group 60–108 kHz, for example, the upper band limit $\omega 1$ is 107,7 kHz and the frequency $\omega o$ is suitably chosen equal 108 kHz. The two temperature sensitive resistors or thermistors R1 and R2 consist in the network according to FIG. 3 of a NTC-resistor with a temperature coefficient $-\alpha$ where $\alpha = B/T^2 > 0$; B is a constant and T = the absolute temperature. For such a resistor, the resistance $$R = A \cdot e^{-\alpha T},$$

where A is a constant characteristic for the resistor. For the network according to FIG. 3, it is valid that at low and high frequences $\neq \omega o$, the voltage attenuation of the network (R1 and R2)

$$A = 20 \log \frac{u_1}{u_2} = 20 \log (1 + \frac{R1}{R2}) =$$
$$20 \log (1 + \frac{A1}{A2} \cdot e^{-(\alpha_2 - \alpha_1)T})$$

if $R1 = A1 \cdot e^{-\alpha_1 T}$ and $R2 = A2 \cdot e^{-\alpha_2 T}$.

By connecting a temperature independent and variable resistor r in series with the thermistor R2, the temperature coefficient $\alpha 1$ of the thermistor R1 can be made equal to the temperature coefficient $\alpha$ of the series connection of the thermistor R2 and the resistor r. Thus, in the expression for A above it is valid that $\alpha 1 = \alpha 2$ and the voltage attenuation will be constant with the temperature. At the resonant frequency $\omega o$ of the parallel circuit L,C, the shunt link has very high impedance and the thermistor R2 can then be regarded to have very little influence on the operative attenauation $A_d$ of the network. The operative attenuation $A_d$ at the resonant frequency $\omega o$ can be calculated as $$Ad = 20 \log (1 + R1/R_o)$$

where $R1 = A1 \cdot e^{-\alpha_1 T}$ and $R_o$ = the matching resistor.

Figure 4:
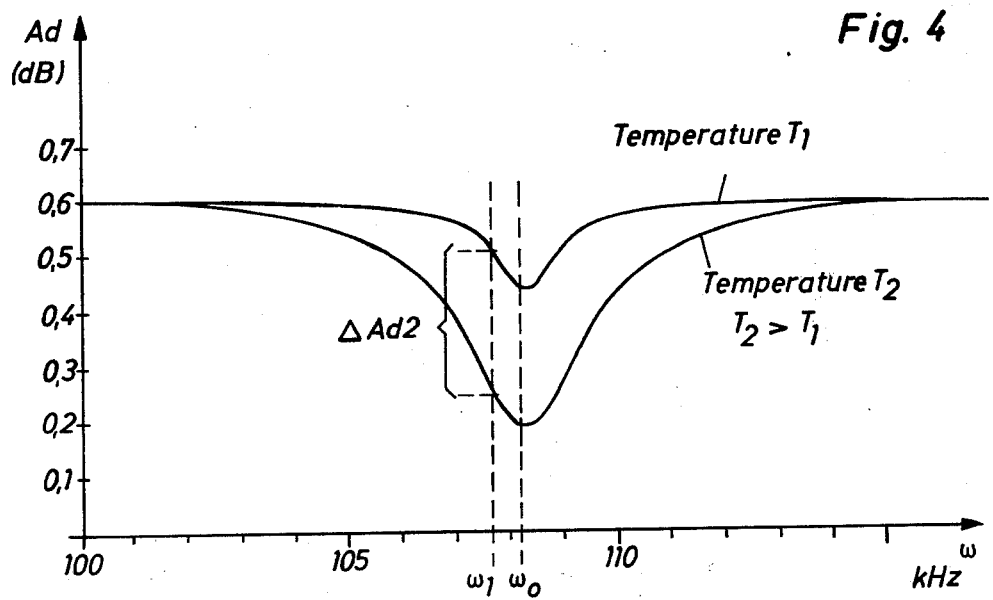
FIG. 4 shows the variation of the operative attenuation as a function of the frequency of a network according to present invention.

At the frequency $\omega o$, the attenuation of the network will then be small at high temperature. In FIG. 4, the attenuation characteristic for the network according to FIG. 3 is further illustrated. The value of the operative attenuation of the network according to the invention near the resonant frequency $\omega o$ is determined by the value of the thermistor R1. The expression for Ad and the diagram according to FIG. 4 show that, at the temperature T2, the attenuation is smaller than at the temperature T1 if T2>T1. The difference $\Delta Ad2$ between the values of the operative attenuation at the frequency $\omega 1$, is chosen equal to the difference $\Delta Ad1$ between the values of the operative attenuation of the equalized filter according to FIG. 1. In this manner, compensation at the band limit can be attained. In practice, the network is used for Ad $\leq$ 1,0 dB.

In a practical case for temperature compensation of the loss attenuation change at the frequency 107,7 kHz in a 12-group through connection filter and for Ro = 700 ohm, the network was dimensioned according to the following values of the included components:

Resistor R1: Thermistor with R(T=25° C.) = 68 ohm $\pm$ 10%, B = 3135 $\pm$ 5%;
Resistor R2: Thermistor with R(T=25° C.) = 15 ohm $\pm$ 10%, B = 4375 $\pm$ 5%;
Resistor r = 2870 ohm;
Inductance L = 0,25 mH, Q $\approx$ 500;
Capacitor C = 8,68 nF With this dimensioning, a good temperature compensation between 15° C. and 55° C. was obtained.

Figure 5:
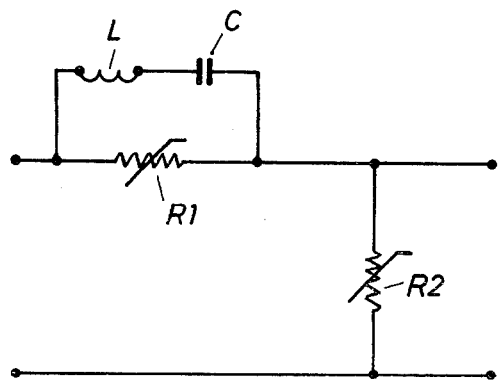
FIG. 5 shows a circuit diagram of another embodiment of the network according to the present invention.

FIG. 5 shows the network with the same function as the network according to FIG. 3 where, instead of PTC-resistors, NTC-resistors are used. The resonant circuit consists in this case of a series resonant circuit L,C, connected in parallel with the PTC-resistor R1 and the resonant frequency $\omega o$ is chosen as in the network according to FIG. 3 near the filter band limit $\omega_1$.

We claim:

1. A compensation network for a passive LC-filter having a loss attenuation deviating a given value from a determined value dependent on the temperature at a band limit of the filter, said compensating network comprising a four-pole terminal link for connection in cascade with the filter, said link having: a series arm including a first temperature dependent resistor; and a shunt arm including a second temperature dependent resistor and a parallel resonant circuit connected in series, the resonant frequency of said parallel resonant circuit mainly coinciding with the chosen band limit frequency of the filter in order that the operative attenuation of the link at the resonant frequency changes with the temperature and with such an amount which corresponds to the given deviating values of the loss attenuation of the filter.

2. A network as claimed in claim 1, wherein a variable temperature independent resistor is connected in series with the temperature dependent resistor in the shunt arm to obtain the desired temperature coefficient in the shunt arm.

3. The compensation network of claim 1 wherein said temperature dependent resistors have negative temperature coefficients.

4. A compensation network for a passive LC-filter having a loss attenuation deviating a given value from a determined value dependent on the temperature at a band limit of the filter, said compensation network comprising a four-pole terminal link for connection in cascade with the filter, said link having: a shunt arm including a first temperature dependent resistor; and a series arm comprises a series resonant circuit, and a second temperature dependent resistor in parallel with said series resonant circuit, and the resonant frequency of said series resonant circuit mainly coinciding with the chosen band limit frequency of the filter in order that the operative attenuation of the link at the resonant frequency changes with the temperature and with such an amount which corresponds to the given deviating value of the loss attenuation of the filter.

5. The compensation network of claim 4 wherein said temperature-sensitive resistors have positive temperature coefficients.

* * * * *